United States Patent
Zhou et al.

(10) Patent No.: US 10,389,342 B2
(45) Date of Patent: Aug. 20, 2019

(54) COMPARATOR

(71) Applicant: HEWLETT PACKARD ENTERPRISE DEVELOPMENT LP, Houston, TX (US)

(72) Inventors: Dacheng Zhou, Fort Collins, CO (US); Daniel Alan Berkram, Fort Collins, CO (US); Ryan Barnhill, Fort Collins, CO (US); Christopher Allan Poirier, Fort Collins, CO (US); Christopher Wilson, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/635,728

(22) Filed: Jun. 28, 2017

(65) Prior Publication Data
US 2019/0007037 A1    Jan. 3, 2019

(51) Int. Cl.
| H03L 7/08 | (2006.01) |
| G06F 17/10 | (2006.01) |
| B62D 5/04 | (2006.01) |
| H03M 1/48 | (2006.01) |
| H03F 1/02 | (2006.01) |
| G01S 1/00 | (2006.01) |
| H03M 1/64 | (2006.01) |
| H03K 5/24 | (2006.01) |
| H03F 3/45 | (2006.01) |

(Continued)

(52) U.S. Cl.
CPC ............... H03K 5/24 (2013.01); G01D 5/204 (2013.01); H03F 3/45479 (2013.01); H03K 19/20 (2013.01); H03M 9/00 (2013.01); H04L 25/03076 (2013.01)

(58) Field of Classification Search
CPC .......... H03K 5/24; H03K 19/20; G01D 5/204; H03F 3/45479; H03M 9/00; H04L 25/03076
USPC ...... 327/91–96, 334, 337, 554; 341/122–125
See application file for complete search history.

(56) References Cited

U.S. PATENT DOCUMENTS

| 5,032,744 A | 7/1991 | Liu |
| 5,243,592 A | 9/1993 | Perlman et al. |

(Continued)

FOREIGN PATENT DOCUMENTS

| CN | 101576805 A | 11/2009 |
| CN | 102521058 A | 6/2012 |

(Continued)

OTHER PUBLICATIONS

Razavi, B. et al,, "Design Techniques for High-Speed, High-Resolution Comparators," (Research Paper), IEEE Journal of Solid-State Circuits 27.12, Dec. 12, 1992, pp. 1916-1926, http://www.seas.ucla.edu/brweb/papers/Journals/R%26WDec92_2.pdf.

(Continued)

*Primary Examiner* — Brandon S Cole
(74) *Attorney, Agent, or Firm* — Hewlett Packard Enterprise Patent Department

(57) ABSTRACT

A comparator includes a resolver controlled by a resolver clock signal and a differential amplifier controlled by a sampling clock signal. The resolver clock signal and the sampling clock signal are such that amplification at the differential amplifier during the reset phase of the resolver clock signal and the reset phase of the sampling clock signal begins during the resolving phase of the resolver.

19 Claims, 7 Drawing Sheets

(51) Int. Cl.
*H03K 19/20* (2006.01)
*G01D 5/20* (2006.01)
*H03M 9/00* (2006.01)
*H04L 25/03* (2006.01)

(56) References Cited

U.S. PATENT DOCUMENTS

| | | | |
|---|---|---|---|
| 5,327,553 A | 7/1994 | Jewett et al. | |
| 5,533,999 A | 7/1996 | Hood et al. | |
| 5,546,535 A | 8/1996 | Stallmo et al. | |
| 5,555,266 A | 9/1996 | Buchholz et al. | |
| 5,633,996 A | 5/1997 | Hayashi et al. | |
| 5,633,999 A | 5/1997 | Clowes et al. | |
| 5,724,046 A * | 3/1998 | Martin | G01S 19/32 342/357.69 |
| 5,905,871 A | 5/1999 | Buskens et al. | |
| 6,073,218 A | 6/2000 | DeKoning et al. | |
| 6,081,907 A | 6/2000 | Witty et al. | |
| 6,092,191 A | 7/2000 | Shimbo et al. | |
| 6,141,324 A | 10/2000 | Abbott et al. | |
| 6,151,659 A | 11/2000 | Solomon et al. | |
| 6,181,704 B1 | 1/2001 | Drottar et al. | |
| 6,389,373 B1 * | 5/2002 | Ohya | H03M 1/485 347/116 |
| 6,457,098 B1 | 9/2002 | DeKoning et al. | |
| 6,467,024 B1 | 10/2002 | Bish et al. | |
| 6,490,659 B1 | 12/2002 | McKean et al. | |
| 6,502,165 B1 | 12/2002 | Kishi et al. | |
| 6,510,500 B2 | 1/2003 | Sarkar et al. | |
| 6,542,960 B1 | 4/2003 | Wong et al. | |
| 6,654,830 B1 | 11/2003 | Taylor et al. | |
| 6,735,645 B1 | 5/2004 | Weber et al. | |
| 6,826,247 B1 * | 11/2004 | Elliott | G09G 5/008 327/150 |
| 6,834,326 B1 | 12/2004 | Wang et al. | |
| 6,911,864 B2 * | 6/2005 | Bakker | H03F 1/303 330/9 |
| 6,938,091 B2 | 8/2005 | Das Sharma | |
| 6,970,987 B1 | 11/2005 | Ji et al. | |
| 7,366,808 B2 | 4/2008 | Kano et al. | |
| 7,506,368 B1 | 3/2009 | Kersey et al. | |
| 7,738,540 B2 | 6/2010 | Yamasaki et al. | |
| 7,839,858 B2 | 11/2010 | Wiemann et al. | |
| 7,908,513 B2 | 3/2011 | Ogasawara et al. | |
| 7,934,055 B2 | 4/2011 | Flynn et al. | |
| 7,996,608 B1 | 8/2011 | Chatterjee et al. | |
| 8,005,051 B2 | 8/2011 | Watanabe | |
| 8,018,890 B2 | 9/2011 | Venkatachalam et al. | |
| 8,054,789 B2 | 11/2011 | Boariu et al. | |
| 8,103,869 B2 | 1/2012 | Balandin et al. | |
| 8,135,906 B2 | 3/2012 | Wright et al. | |
| 8,161,236 B1 | 4/2012 | Noveck et al. | |
| 8,169,908 B1 | 5/2012 | Sluiter et al. | |
| 8,171,227 B1 | 5/2012 | Goldschmidt et al. | |
| 8,332,704 B2 | 12/2012 | Chang et al. | |
| 8,341,459 B2 | 12/2012 | Kaushik et al. | |
| 8,386,834 B1 | 2/2013 | Goel et al. | |
| 8,386,838 B1 | 2/2013 | Byan et al. | |
| 8,462,690 B2 | 6/2013 | Chang et al. | |
| 8,483,116 B2 | 7/2013 | Chang et al. | |
| 8,605,643 B2 | 12/2013 | Chang et al. | |
| 8,619,606 B2 | 12/2013 | Nagaraja | |
| 8,621,147 B2 | 12/2013 | Galloway et al. | |
| 8,667,322 B1 | 3/2014 | Chatterjee et al. | |
| 8,700,570 B1 | 4/2014 | Marathe et al. | |
| 8,793,449 B1 | 7/2014 | Kimmel | |
| 8,812,901 B2 | 8/2014 | Sheffield, Jr. | |
| 9,128,948 B1 | 9/2015 | Raorane | |
| 9,166,541 B2 * | 10/2015 | Funato | H03F 3/393 |
| 9,298,549 B2 | 3/2016 | Camp et al. | |
| 9,621,934 B2 | 4/2017 | Seastrom et al. | |
| 2001/0002480 A1 | 5/2001 | DeKoning et al. | |
| 2002/0162076 A1 | 10/2002 | Talagala et al. | |
| 2003/0037071 A1 | 2/2003 | Harris et al. | |
| 2003/0126315 A1 | 7/2003 | Tan et al. | |
| 2004/0133573 A1 | 7/2004 | Miloushev et al. | |
| 2004/0233078 A1 * | 11/2004 | Takehara | H03M 1/645 341/116 |
| 2005/0027951 A1 | 2/2005 | Piccirillo et al. | |
| 2005/0044162 A1 | 2/2005 | Liang et al. | |
| 2005/0120267 A1 | 6/2005 | Burton et al. | |
| 2005/0144406 A1 | 6/2005 | Chong, Jr. | |
| 2005/0157697 A1 | 7/2005 | Lee et al. | |
| 2006/0112304 A1 | 5/2006 | Subramanian et al. | |
| 2006/0129559 A1 | 6/2006 | Sankaran et al. | |
| 2006/0264202 A1 | 11/2006 | Hagmeier et al. | |
| 2007/0028041 A1 | 2/2007 | Hallyal et al. | |
| 2007/0140692 A1 | 6/2007 | Decusatis et al. | |
| 2007/0168693 A1 | 7/2007 | Pittman | |
| 2007/0174657 A1 | 7/2007 | Ahmadian et al. | |
| 2008/0060055 A1 | 3/2008 | Lau | |
| 2008/0137669 A1 | 6/2008 | Balandina et al. | |
| 2008/0201616 A1 | 8/2008 | Ashmore | |
| 2008/0281876 A1 | 11/2008 | Mimatsu | |
| 2009/0080432 A1 | 3/2009 | Kolakeri et al. | |
| 2009/0259882 A1 | 10/2009 | Shellhamer | |
| 2009/0313313 A1 * | 12/2009 | Yokokawa | G01D 5/24476 708/300 |
| 2010/0107003 A1 | 4/2010 | Kawaguchi | |
| 2010/0114889 A1 | 5/2010 | Rabii et al. | |
| 2011/0109348 A1 | 5/2011 | Chen et al. | |
| 2011/0173350 A1 | 7/2011 | Coronado et al. | |
| 2011/0208994 A1 | 8/2011 | Chambliss et al. | |
| 2011/0213928 A1 | 9/2011 | Grube et al. | |
| 2011/0246819 A1 | 10/2011 | Callaway et al. | |
| 2011/0314218 A1 | 12/2011 | Bert | |
| 2012/0032718 A1 * | 2/2012 | Chan | H03L 7/093 327/156 |
| 2012/0059800 A1 | 3/2012 | Guo | |
| 2012/0096329 A1 | 4/2012 | Taranta, II | |
| 2012/0137098 A1 | 5/2012 | Wang et al. | |
| 2012/0166699 A1 | 6/2012 | Kumar et al. | |
| 2012/0166909 A1 | 6/2012 | Schmisseur et al. | |
| 2012/0201289 A1 | 8/2012 | Abdalla et al. | |
| 2012/0204032 A1 | 8/2012 | Wilkins et al. | |
| 2012/0213055 A1 | 8/2012 | Bajpai et al. | |
| 2012/0297272 A1 | 11/2012 | Bakke et al. | |
| 2012/0311255 A1 | 12/2012 | Chambliss | |
| 2013/0060948 A1 | 3/2013 | Ulrich et al. | |
| 2013/0128721 A1 | 5/2013 | Decusatis et al. | |
| 2013/0128884 A1 | 5/2013 | Decusatis et al. | |
| 2013/0138759 A1 | 5/2013 | Chen et al. | |
| 2013/0148702 A1 | 6/2013 | Payne | |
| 2013/0227216 A1 | 8/2013 | Cheng et al. | |
| 2013/0246597 A1 | 9/2013 | Iizawa et al. | |
| 2013/0297976 A1 | 11/2013 | McMillen | |
| 2013/0311822 A1 | 11/2013 | Kotzur et al. | |
| 2013/0312082 A1 | 11/2013 | Izu et al. | |
| 2014/0067984 A1 | 3/2014 | Danilak | |
| 2014/0095865 A1 | 4/2014 | Yerra et al. | |
| 2014/0115232 A1 | 4/2014 | Goss et al. | |
| 2014/0136799 A1 | 5/2014 | Fortin | |
| 2014/0269731 A1 | 9/2014 | Decusatis et al. | |
| 2014/0281688 A1 | 9/2014 | Tiwari et al. | |
| 2014/0304469 A1 | 10/2014 | Wu | |
| 2014/0331297 A1 | 11/2014 | Innes et al. | |
| 2015/0012699 A1 | 1/2015 | Rizzo et al. | |
| 2015/0095596 A1 | 4/2015 | Yang et al. | |
| 2015/0146614 A1 | 5/2015 | Yu et al. | |
| 2015/0199244 A1 | 7/2015 | Venkatachalam et al. | |
| 2015/0288752 A1 | 10/2015 | Voigt | |
| 2016/0034186 A1 | 2/2016 | Weiner et al. | |
| 2016/0170833 A1 | 6/2016 | Segura et al. | |
| 2016/0196182 A1 | 7/2016 | Camp et al. | |
| 2016/0226508 A1 * | 8/2016 | Kurooka | H03M 1/485 |
| 2017/0253269 A1 * | 9/2017 | Kanekawa | B62D 5/0481 |
| 2017/0302409 A1 | 10/2017 | Sherlock | |
| 2017/0346742 A1 | 11/2017 | Shahar et al. | |

FOREIGN PATENT DOCUMENTS

| | | |
|---|---|---|
| CN | 104333358 A | 2/2015 |
| EP | 1347369 B1 | 11/2012 |
| IN | 1546/MUM/2013 | 3/2015 |

(56) References Cited

FOREIGN PATENT DOCUMENTS

| TW | 201346530 A | 11/2013 |
|---|---|---|
| WO | WO-02091689 A1 | 11/2002 |
| WO | 2014/120136 A1 | 8/2014 |

OTHER PUBLICATIONS

Xingyuan, T. et al., "An Offset Cancellation Technique in a Switched-Capacitor Comparator for SAR ADCs," (Research Paper), Journal of Semiconductors 33.1, Jan. 2012, 5 pages, http://www.jos.ac.cn/bdtxbcn/ch/reader/create_pdf.aspx?file_no=11072501.
Almeida, P. S., et al; Scalable Eventually Consistent Counters Over Unreliable Networks; Jul. 12, 2013; 32 Pages.
Amiri, K. et al., Highly Concurrent Shared Storage, (Research Paper), Sep. 7, 1999, 25 Pages.
International Search Report and Written Opinion; PCT/US2014/053704; dated May 15, 2015; 13 pages.
International Search Report and Written Opinion; PCT/US2015/013898; dated Oct. 8, 2015; 11 pages.
Mao, Y. et al., A New Parity-based Migration Method to Expand Raid-5, (Research Paper), Nov. 4, 2013, 11 Pages.
Kimura et al., "A 28 Gb/s 560 mW Multi-Standard SerDes With Single-Stage Analog Front-End and 14-Tap Decision Feedback Equalizer in 28 nm CMOS," IEEE Journal of Solid-State Circuits, vol. 49, No. 12, Dec. 2014, pp. 3091-3103.
International Searching Authority, The International Serach Report 6 and the Written Opinion, dated Feb. 26, 2015, 10 Pages.
Li, M. et al.: Toward I/O-Efficient Protection Against Silent Data Corruptions in RAID Arrays, (Research Paper); Jun. 2-6, 2014; 12 Pages.
Kang, Y. et al., "Fault-Tolerant Flow Control in On-Chip Networks," (Research Paper), Proceedings for IEEE, May 3-6, 2010, 8 pages, available at http://citeseerx.ist.psu.edu/viewdoc/download?doi=10.1.1.228.7865&rep=rep1&type=pdf.
International Search Report and Written Opinion received for PCT Patent Application No. PCT/US2015/023708, dated Apr. 22, 2016, 11 pages.
International Search Report and Written Opinion received for PCT Patent Application No. PCT/US2015/013921, dated Oct. 28, 2015, 10 pages.
International Search Report and Written Opinion received for PCT Patent Application No. PCT/US2014/062196, dated Jun. 30, 2015, 13 pages.
International Preliminary Report on Patentability received for PCT Patent Application No. PCT/US2015/023708, dated Oct. 12, 2017, 10 pages.
International Preliminary Report on Patentability received for PCT Patent Application No. PCT/US2015/013921, dated Aug. 10, 2017, 9 pages.
International Preliminary Report on Patentability received for PCT Patent Application No. PCT/US2015/013817, dated Aug. 10, 2017, 9 pages.
International Preliminary Report on Patentability received for PCT Patent Application No. PCT/US2014/062196, dated May 4, 2017, 12 pages.
EMC2; High Availability and Data Protection with EMC Isilon Scale-out NAS, (Research Paper); Nov. 2013; 36 Pages.
Do I need a second RAID controller for fault-tolerance?, (Research Paper); Aug. 22, 2010; 2 Pages; http://serverfault.com/questions/303869/do-i-need-a-second-raid-controller-for-fault-tolerance.
International Search Report and Written Opinion received for PCT Patent Application No. PCT/US2015/013817, dated Oct. 29, 2015, 11 pages.
International Preliminary Report on Patentability received for PCT Patent Application No. PCT/US2015/013898, dated Aug. 10, 2017, 8 pages.
International Preliminary Report on Patentability received for PCT Patent Application No. PCT/US2014/053704, dated Mar. 16, 2017, 10 pages.
International Preliminary Report on Patentability received for PCT Patent Application No. PCT/US2014/049193, dated Feb. 9, 2017, 7 pages.

* cited by examiner

COMPARATOR

BACKGROUND

In high-speed serial communication systems incoming signals may suffer from inter-symbol interference (ISI) and high-speed attenuation. Input gain stages can increase the signal amplitude before reaching the receiver comparator. However, this amplification also amplifies the ISI. This ISI amplification may be compensated for using a decision feedback equalizer (DFE). A DFE is a filter that uses feedback of detected symbols to automatically adapt to time-varying properties of the communication channel.

BRIEF DESCRIPTION OF THE DRAWINGS

Certain examples are described in the following detailed description and in reference to the drawings, in which.

DETAILED DESCRIPTION OF SPECIFIC EXAMPLES

Implementations of the disclosed technology provides a high speed comparator that performs DFE summing that may be used on the critical path of a high speed differential signal receiver. An example implementation provides a comparator utilizing a 14 tap DFE with an unrolled first tap. For example, the disclosed circuits may be used in serializer/deserializer (SERDES) receivers to capture 26 Gbps input data with an eye opening of at least 18 ps width and 25 mv (p-p) height in a communication system having −35 dB channel attenuation at 13 GHz.

Figure 1:
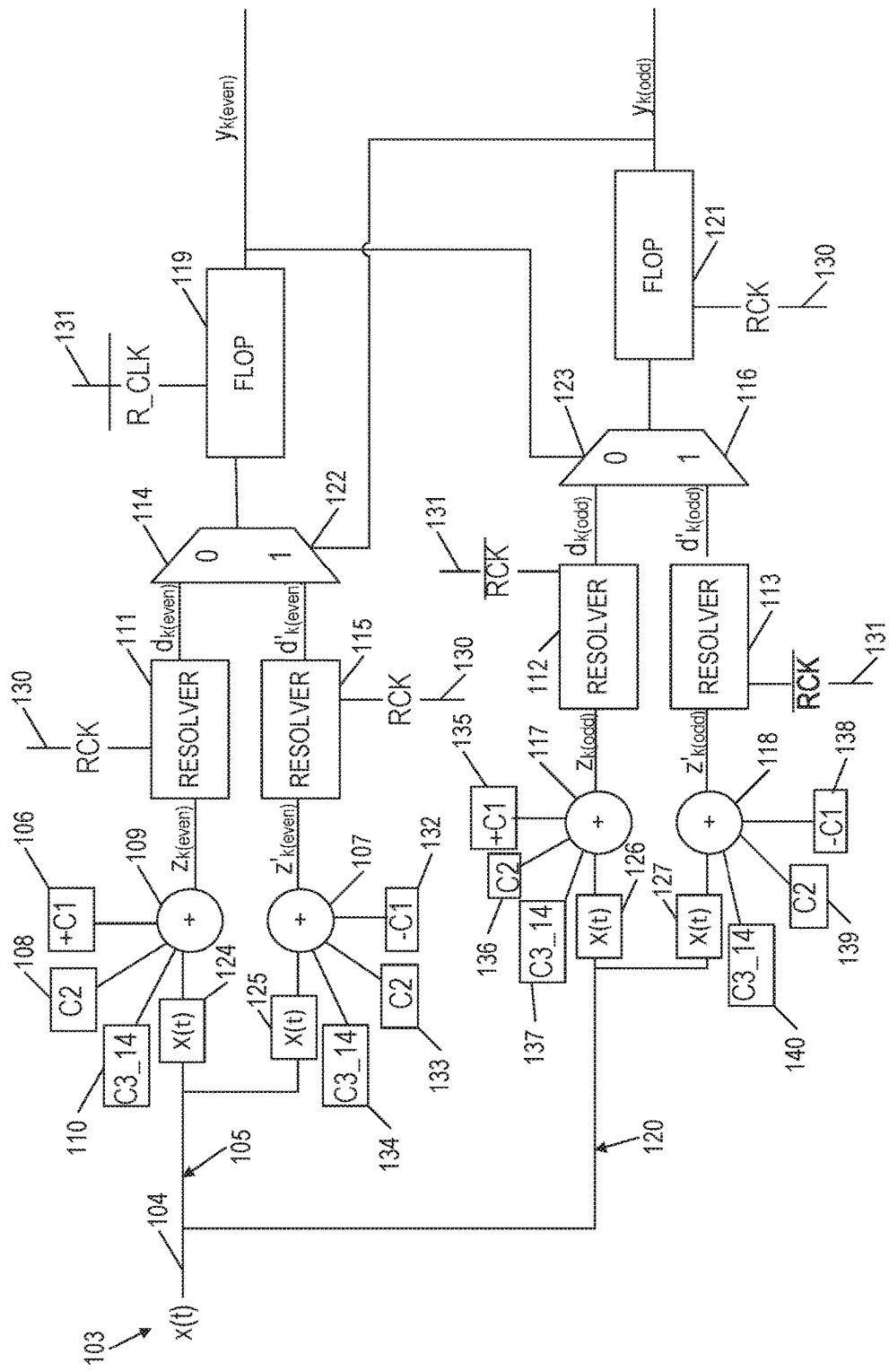
FIG. 1 illustrates a portion of an analog to digital converter circuit including a DFE filter with an unrolled first tap.

FIG. 1 illustrates an example portion of an analog to digital converter circuit including a 14 tap DFE filter with an unrolled first tap. The circuit includes an analog signal input 104 that receives a signal $x(t)$ 103. For example, the input signal $x(t)$ 103 may be an output from earlier analog front-end circuitry.

The illustrated circuitry operates at one half the clock speed of the signal to be received. For example, a 13 GHz clock may be used to receive a 26 Gbps signal. The circuitry includes a first branch 105 to output every other bit of the input signal 103, and a second branch 120 to output the remaining every other bit of the input signal 103. For example, the circuitry may receive a signal $x(t)$ and the first branch 105 may output an even signal $y_k$, where k is even.

The first branch 105 includes pairs of resolvers 111, 115 and summation blocks 109, 107. The first resolver 111 is gated by a resolver clock signal 130. For example, to receive a 26 Gbps signal 104, the resolver clock signal 130 is a 13 GHZ clock. The resolver 111 is coupled to an output 119 via a multiplexor 122. The resolver 111 is also coupled to the input data signal 104 via a first input data signal circuit 124, a signed first tap coefficient bias circuit 106, a first qualified second tap bias circuit 108, and a first combined tap coefficient bias circuit 110 via summation block 109. On every even kth clock cycle (at the frequency of the signal; in other words, on every clock cycle of resolver clock 130), the first summation block 109 outputs the sum $$z_{k(even)} = x(t) + C_1(t) + C_2(t) + C_{3\_14}(t), \quad (\text{Eq. 1})$$

$$C_1 = -w_1 * y_{k-1}, C_2 = w_2 * y_{k-2}, \text{ and } C_{3\_14} = -\left(\sum_{i=3}^{14} w_i y_{k-i}\right)$$

where x is the input signal, $w_i$ is the tap coefficient corresponding to the ith tap, and $y_{k-i}$ is the final decision (i.e., the digital output from the circuit) from the k-ith clock cycle. The resolver 111 forms a decision $d_{k(even)}$ from this input $z_k$ (e.g., performs digital slicing at each even kth clock cycle on this input).

The second resolver 115 is also gated by the resolver clock signal 130 and is coupled to output 119 via mux 114. The second resolver is coupled to the input signal 104 via a second input data signal circuit 125, an opposite signed first tap coefficient bias circuit 132, a second qualified second tap bias circuit 133, and a second combined tap coefficient bias circuit. The second summation block 107 outputs the sum $Z'_{k(even)}=x(t)-C_1(t)+C_2(t)+C_{3\_14}(t)$ (Eq. 2), where x and the C terms are as described with respect to Eq. 1. (Note, either +C1 or −C1 may be negative or positive, '+' and '−' are used to indicate that they have opposite signs.) The resolver 115 forms a decision $d'_{k(even)}$ from the input $z'_{k(even)}$. Each resolver 111, 115 outputs its decision to multiplexor 114. The multiplexor 114 outputs a selected input (i.e., the output $d_k$ of resolver 111 or $d'_k$ of resolver 115) to flip-flop 119, which outputs the even cycles of the digital signal $y_k$ based on whether $d_k$ or $d'_k$ is selected at the control port 122.

The second branch 120 includes a second set of resolvers 112, 113 and summation blocks 117, 118. The second set of resolvers 112, 113 are gated by an inverse resolver clock signal 131, which is the inverse of the resolver clock signal 130 (i.e., when the resolver clock signal 130 is high, the inverse resolver clock signal 131 is low, and vice versa). The second branch 120 outputs the portion of the output signal $y_k$ where k is odd.

The third resolver 112 is gated by the inverse clock signal 131 and coupled to a second output 121 via a second mux 123. The third resolver 112 is coupled to the input signal 104 via a third input data signal circuit 126, a second signed first tap coefficient bias circuit 135, a third qualified second tap bias circuit 136, and a third combined tap coefficient bias circuit 137. On every odd kth clock cycle, the third summation block 117 outputs the sum $z_{k(odd)}=x(t)+C_1(t)+C_2(t)+C_{3\_14}(t)$ (Eq. 3), where x and the C terms are as described with respect to Eq. 1. The resolver 112 forms a decision $d_{k(odd)}$ from this input.

The fourth resolver 113 is also gated by the inverse clock signal 131 and coupled to the second output 121 via the second mux 123. The fourth resolver 113 is coupled to the input signal 104 via a fourth input data signal circuit 127, a second opposite signed first tap coefficient bias circuit 138, a fourth qualified second tap bias circuit 139, and a fourth combined tap coefficient bias circuit 140. The fourth summation block 118 outputs the sum $Z'_{k(odd)}=x(t)-C_1(t)+C_2(t)+C_{3\_14}(t)$ (Eq. 4), where x and the C terms are as described with respect to Eq. 1. The resolver 113 forms a decision $d'_{k(odd)}$ from this input.

Each resolver 112, 113 outputs its decision to multiplexor 116. The multiplexor outputs a selected input (i.e., the output $d_k$ of resolver 112 or $d'_k$ of resolver 113) to flip-flop 121, which outputs the odd cycles of the digital signal $y_k$ based on whether $d_k$ or $d'_k$ is selected at the control port 123.

Each branch's output is used to perform the sign unrolling of the first tap coefficient. The output of the latch 121, 119 on each branch controls the output of the multiplexor 114, 116 of the other branch. In other words, the output of latch 121 controls the output of multiplexor 114 and the output of latch 119 controls the output of multiplexor 116. As seen from equations 1 and 2, $d_{k(even)}$ and $d'_{k(even)}$ differ by the sign of $y_{k-1}$, which is the last output of branch 120. Accordingly, the output of flip-flop 121 is used to select which resolver's output corresponds to the actual decision value for the preceding symbol. Similarly, $d_{k(odd)}$ and $d'_{k(odd)}$ differ by the sign of $y_{k-1}$, which, for resolvers 112, 113, is the last output of branch 105. Accordingly, the output of flip-flop 119 is used to select which resolver's output corresponds to the correct decision value for the preceding symbol.

In the illustrated example flip-flops 119 and 121 are edge triggered flip-flops gated by the inverse resolver clock signal 131, and resolver clock signal 130, respectively. In other examples, instead of a flop 119, the output 119 may be implemented as a latch with additional SR latches (not illustrated) attached to the output the resolvers 111 and 115.

Figure 2A:
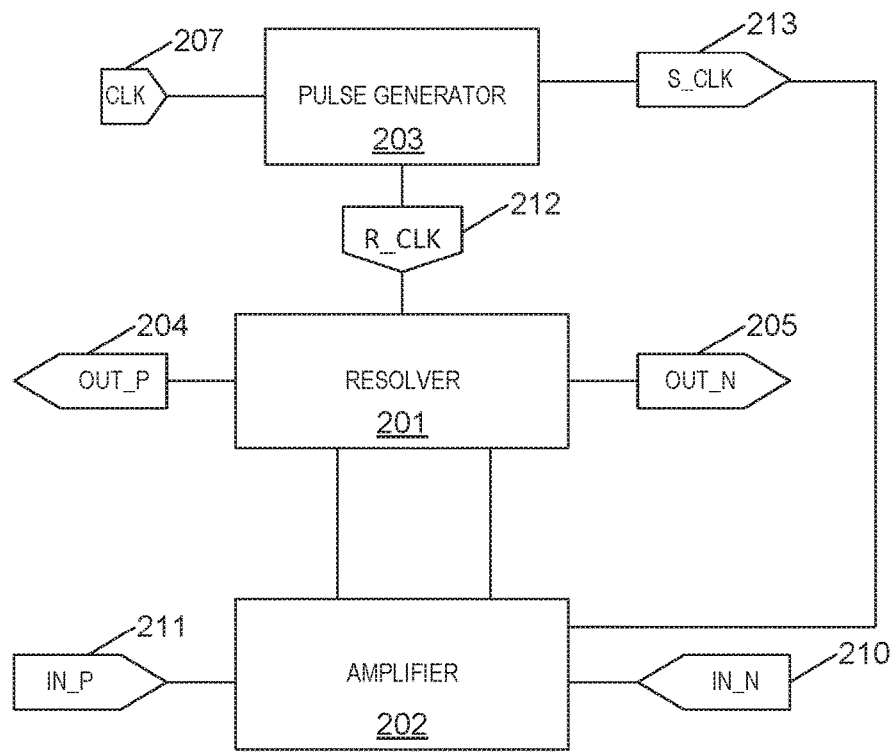
FIG. 2A illustrates a comparator.
Figure 2B:
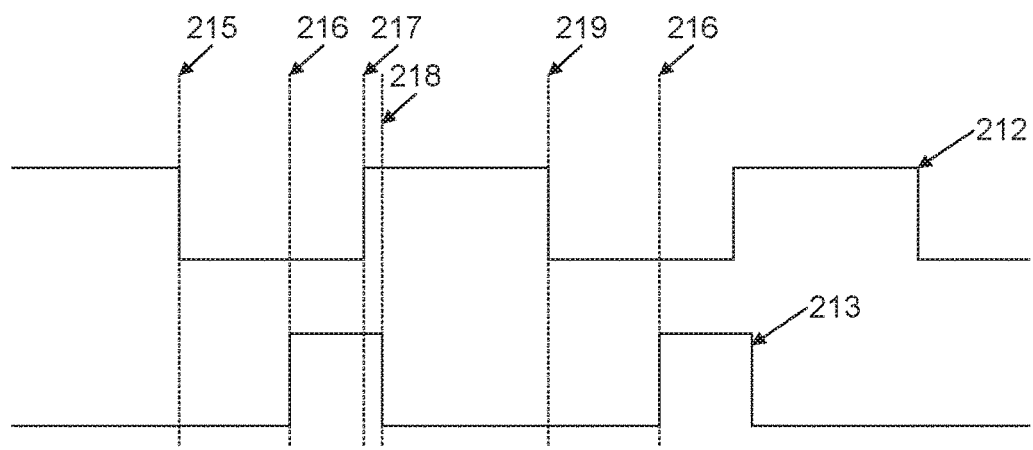
FIG. 2B illustrates example control signals to control the comparator of FIG. 2A.

FIG. 2A illustrates a comparator and FIG. 2B illustrates example control signals to control the comparator. For example, the resolvers, bias circuits and summation blocks of FIG. 1 may be implemented as illustrated in FIGS. 2A and 2B. The comparator includes a resolver 201. The resolver 201 outputs a decision via a differential output pair 204, 205. For example, the differential output may comprise a positive output 204 and a negative output 205. For example, the comparator may output a differential digital signal as a digital one or a digital zero based on a received input differential analog signal and one or more filter stages, such as a multi-tap DFE filter.

The resolver 201 is controlled by a resolver clock signal 212. The resolver clock signal 212 includes a resolving phase 217-219, and a resolver reset phase 215-217. The resolver 201 outputs the decision during the resolving phase 217-219. The resolver 201 stops output during the reset phase 215-217.

The comparator further comprises a differential amplifier 202 coupled to the resolver 201. The amplifier includes a differential input signal input pair 211, 210. For example, the amplifier 202 may include a positive input 211 and a negative input 210. In various implementations, the input signal may be a main input data signal, or a bias voltage generated by a tap filter. For example, the amplifier 202 may be any of the input data signal circuits 124-127, or bias circuits 106, 132, 134, 110, 135, 138, 140, 137.

The amplifier 202 is controlled by a sampling clock signal 213. The sampling clock signal includes a sampling phase 216-217, a hold phase 217-218, and a reset phase 218-216. The amplifier 202 amplifies the input signal 211, 210 during the sampling phase 216-217. The amplifier 202 outputs the amplified signal and influences the resolver 201 with the amplified signal during the sampling phase 216-217 and the hold phase 217-218. The hold phase is the period of overlap between the sampling clock and the resolver clock. Accordingly, the resolver begins to regenerate and make a decision during this hold phase 217-218 and arrives at the decision later during the resolving phase 217-219 of the resolver clock. In various implementations, the hold phase may be arbitrarily small as long as the output signal from the amplifier 202 is presented to the resolver when the resolving phase begins at 217.

The comparator further comprises a pulse generator 203. The pulse generator 203 receives a main clock signal 207 and generates the resolver clock signal 212 and the sampling clock signal 213. For example, the main clock signal 207 may be a system clock or clock signal derived from a system-wide clock signal. As illustrated, the sampling phase 216-217 occurs during the resolver reset phase 215-217. Accordingly, amplifier regeneration and input signal amplification time is hidden by the resolver reset phase. The hold phase occurs at the beginning of the resolving phase and ends early in the resolving phase (for example, during the first 5% or 10% of the resolving phase) so that subsequent input changes do not influence the current resolving phase.

FIGS. 3A-3I illustrate various aspects of an example comparator implemented in a receiver system utilizing a fourteen tap DFE filter with an unrolled first tap. An example of such a system is illustrated and described in further detail with respect to FIG. 1. However, the illustrated circuitry may be employed in other comparators, with more or fewer taps, and with or without tap unrolling, depending on characteristics of the signaling system. For example, the comparator of FIG. 2A-B may be implemented as illustrated in FIGS. 3A-I.

Figure 3A:
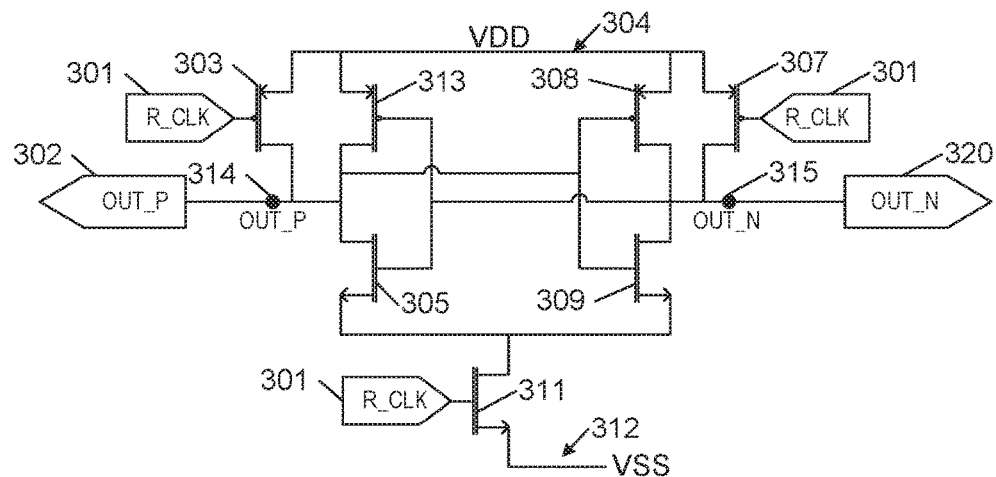
FIGS. 3A-3E illustrate circuitry of an example comparator.
Figure 3B:
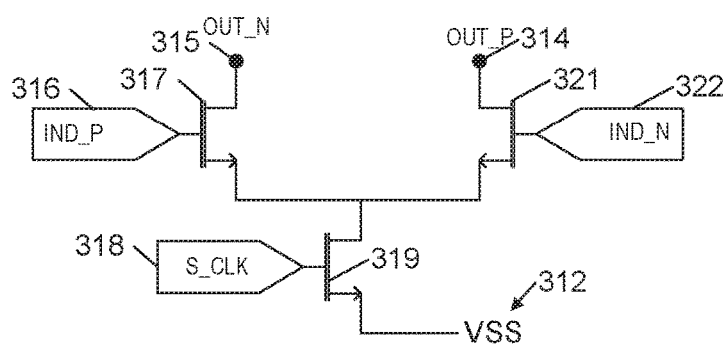
Figure 3C:
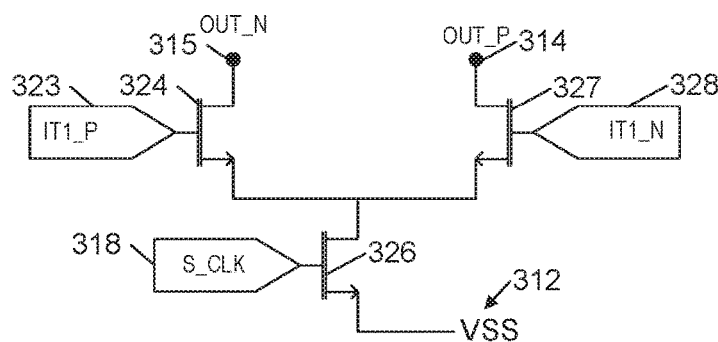
Figure 3D:
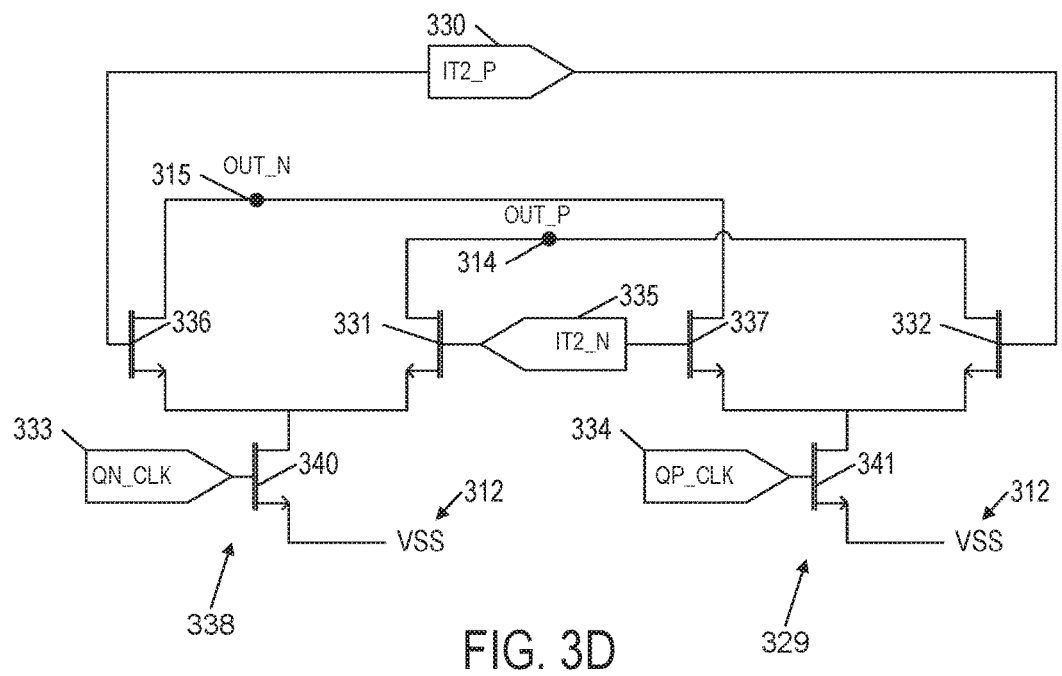
Figure 3E:
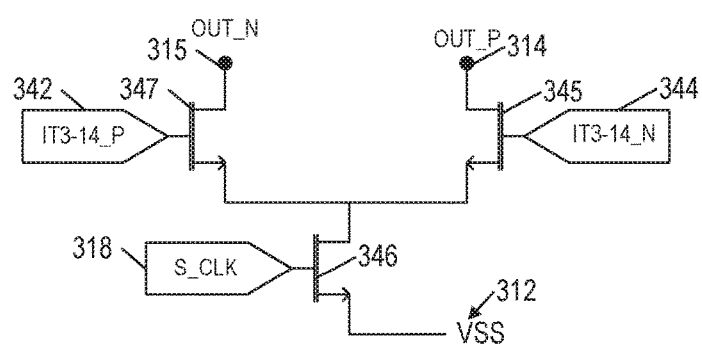
Figure 3F:
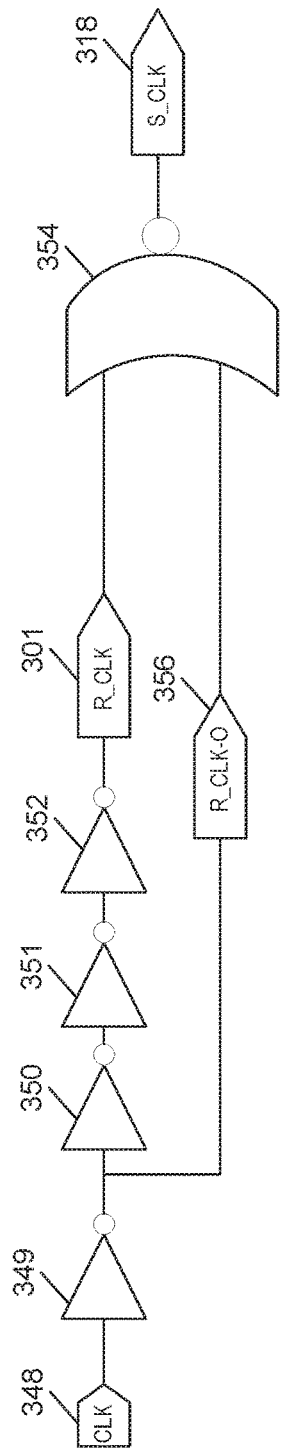
FIGS. 3F-3H illustrate example clock circuitry for the example comparator.
Figure 3H:
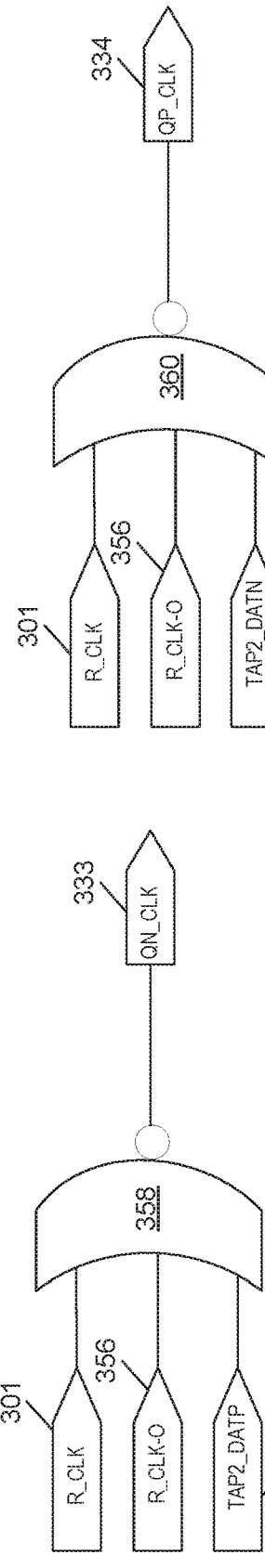
Figure 3G:
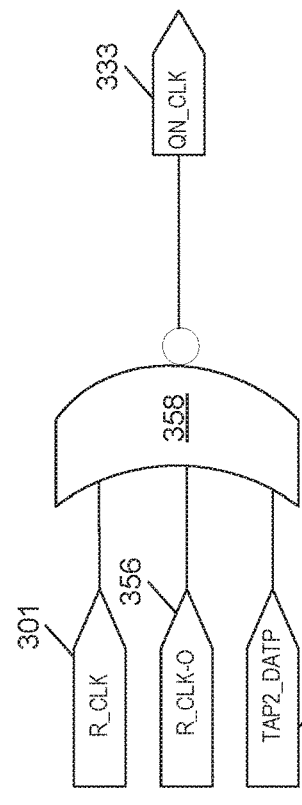
Figure 3I:
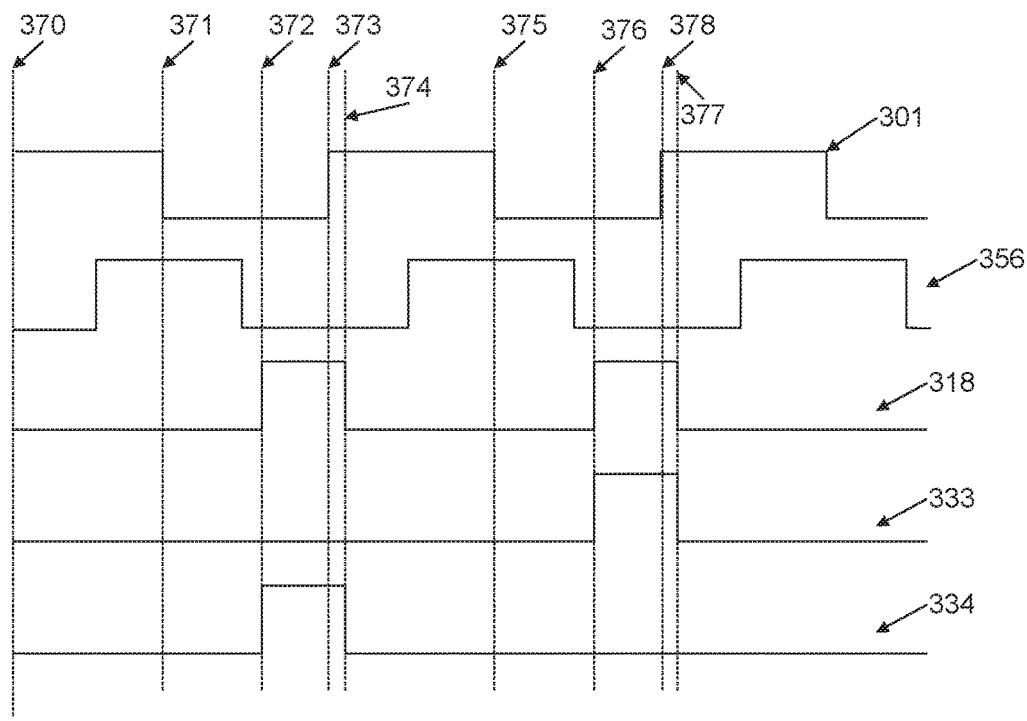
FIG. 3I illustrates example clock signals produced by the example clock circuitry and used to control the example comparator.

FIGS. 3A-E illustrate an example comparator, FIGS. 3F-H illustrate example clock circuitry for the example comparator, and FIG. 3I illustrates example clock signals produced by the example clock circuitry and used to control the example comparator.

The comparator includes a resolver, as illustrated in FIG. 3A. The resolver outputs a differential signal via positive side output 302 and negative side output 320. For example, the resolver may output the signals $d_{k(even)}$, $d_{k(odd)}$, $d'_{k(even)}$, or $d'_{k(odd)}$ as discussed with respect to FIG. 1. The resolver includes a cross-coupled inverter formed by transistors 313, 308, 305, and 309. A first inverter provides a positive side 302 of a differential signal output at a first storage node 314 and consists of a p-channel field effect transistor (P-FET) with inverted gate 313 and an n-channel FET (N-FET) 305. A second inverter provides the negative side 320 of the differential signal output at a second storage node 315 and consists of a P-FET with inverted gate 308 and an N-FET 309.

The resolver is controlled by a resolver clock signal 301. Illustrated in FIG. 3I, the resolver clock signal 301 includes a resolving phase 373-375 and a resolver reset phase 371-373. In the illustrated example, the resolver further comprises a first transistor 303 gated by the resolver clock signal 301. In this example, transistor 303 is a P-FET 303 in parallel with inverter transistor 313, which couples a positive power supply voltage (VDD) 304 to the output node 314. The resolver further comprises a second transistor 307 gated by the resolver clock signal 301 in parallel with the inverter transistor 308 that couples VDD 304 to the output node 315. The resolver further comprises a third transistor, (in this case, an N-FET) 311 in series with inverter transistors 305, 309, which couple the first and second output nodes 314, 315 to a negative supply voltage (VSS) 312.

In the illustrated example, the resolver is coupled to a number of differential amplifiers (FIGS. 3B-E). The outputs of the differential amplifiers are coupled to the storage nodes of the resolver 314, 315. Accordingly, their output currents are summed in parallel fashion, influencing the output voltages at nodes 314 and 315.

The differential amplifier of FIG. 3B outputs an amplified main data differential input signal to the resolver and is controlled by a sampling clock signal 318. For example, the input data signal circuits 124, 125, 126, and 127 may be implemented as illustrated in FIG. 3B. The sampling clock signal 318 includes a sampling phase 372-373, a hold phase 373-374, and a sampling reset phase 374-376 (FIG. 3I). The amplifier amplifies a main input data signal 316, 322 during the sampling phase, holds the amplified main input data signal during the hold phase, and is in reset during the sampling reset phase.

The amplifier comprises a pair of differential inputs 316, 322 coupled to the differential input data signal (e.g., x(t) in FIG. 1). In the illustrated example, the positive input signal 316 is coupled to the gate of the transistor 317 coupling the negative output node 315 to VSS 312 during the sampling phase of the sampling clock signal 318. The negative input data signal 322 is coupled to the gate of the transistor 321 coupling the positive output node 314 to VSS 312 during the sampling phase of the sampling clock signal 318. The sampling clock signal 318 is coupled to the gate of transistor 319, which is in series with transistors 317 and 321 and VSS 312.

The differential amplifier of FIG. 3C outputs an amplified first tap bias voltage to the resolver. The amplifier is controlled by the sampling clock signal 318 in a manner similar to the amplifier of FIG. 3B. The amplifier amplifies the bias voltage for the first tap during the sampling phase, holds the amplified first tap bias voltage during the hold phase, and is in reset during the sampling rest phase.

In an example with first tap unrolling, such as illustrated in FIG. 1, there is a separate path for each first tap data value (e.g., for branch 105, the case $w_1^*(y_{k-1})$ (Eq. 1) is handled by resolver 111 and the case $w_1^*(-y_{k-1})$ (Eq.2) is handled by resolver 115). Accordingly, the bias voltage signal received at the differential inputs 323, 328 varies in time as a function of the filter weight $w_1$, which varies slowly compared to the signal rate. Therefore, in this example, the first tap bias voltage is effectively a constant offset voltage.

The amplifier comprises a pair of differential inputs 323, 328 coupled to the differential first tap bias voltage (e.g., either +C1 or −C1 in FIG. 1). In the illustrated example, the positive input signal 323 is coupled to the gate of the transistor 324 coupling the negative output node 315 to VSS 312 during the sampling phase of the sampling clock signal 318. The negative input data signal 328 is coupled to the gate of the transistor 327 coupling the positive output node 314 to VSS 312 during the sampling phase of the sampling clock signal 318. The sampling clock signal 318 is coupled to the gate of transistor 326, which is in series with transistors 324 and 327 and VSS 312.

The circuit of FIG. 3D comprises a qualified tap circuit that outputs an amplified a second tap bias differential voltage to the resolver (e.g., C2 in FIG. 1). Like the circuits of FIGS. 3B and 3C, the circuit amplifies the second tap bias differential voltage during the sampling phase, holds the amplified signal during the hold phase, and is in reset during the sampling reset phase. However, the second tap bias voltage is sign unrolled and controlled using control signals that are qualified using the second tap data signal. The circuit comprises a first side 338 controlled by a first qualified clock signal 333, and a second side 329 controlled by a second qualified clock signal 334.

Side 338 comprises a first transistor 336 having a gate coupled to the positive side 330 of the second tap bias voltage and a second transistor 331 coupled to the negative side 335 of the second tap bias voltage. The first transistor has a drain coupled to the negative output node of the resolver 315, and the second transistor has a drain coupled to the positive output node 314. Both transistors 336, 331 have sources coupled the drain of transistor 340 which is gated by the first qualified clock signal 333, and has a source coupled to VSS 312. The pulse 376-377 coincides with the pulse 376-377 of the sampling clock signal 318 when the second tap data line has a first value. The first qualified clock signal 333 has a sampling phase 376-378, and a hold phase 378-377, and is in reset otherwise. (FIG. 3I). In this example, the first qualified clock signal 333 has a signal pulse coinciding with the sampling clock signal if the second tap data signal is a digital 0, and is in reset otherwise.

The circuit further comprises a second side 329 comprising a second qualified differential amplifier controlled by a second qualified clock signal 334. Side 329 comprises a transistor 332 having a gate coupled to the positive side 330 of the second tap bias voltage and a second transistor 337 coupled to the negative side 335 of the second tap bias voltage. The first transistor 332 has a drain coupled to the positive output node of the resolver 314, and the second transistor 337 has a drain coupled to the negative output node 315. Both transistors 332, 337 have sources coupled the drain of transistor 341 which is gated by the second qualified clock signal 334, which has a source coupled to VSS 312. The second qualified clock signal 334 has a signal pulse 372-374 coinciding with the pulse 372-374 of the sampling clock signal when the second tap's data signal has a second value. The second qualified clock signal 334 has a sampling phase 372-373, and a hold phase 373-374, and is in reset otherwise (FIG. 3I). In this example, the second qualified clock signal 334 has a sampling pulse coinciding with the sampling clock signal if the second tap data signal is a digital 1, and is in reset otherwise.

As illustrated, the first side 338 and second side 329 output signals that have opposite signs from each other. Either the first side 338 or the second side 329 is active simultaneously with the circuits of FIGS. 3B, 3C, and 3E, depending on the value of the second data tap. This arrangement accommodates the sign unrolling of the first tap. The data on the first tap from the immediately preceding symbol is the data on the second tap of the current symbol. For example, if the illustrated resolver is the resolver 113 of FIG. 1, and the previous symbol was output by resolver 115, then the second side 329 will be active. In the same example, if the previous symbol was output by resolver 111, then the first side 338 will be active.

The differential amplifier of FIG. 3E comprises a combined tap coefficient bias circuit that outputs a combined bias voltage to the resolver. The circuit amplifies the combined bias voltage during the sampling phase, holds the amplified voltage during the hold phase, and is in reset during the sample reset phase. The illustrated example utilizes a fourteen tap DFE. In this example, the combined tap bias voltage signal is the combined tap bias voltages from the third through the fourteenth taps (e.g., $C_{3\_14}$ of FIG. 1). For example, a summation prebuffer may combine the tap signals to form the combined tap bias voltage.

The amplifier comprises a pair of differential inputs 342, 344. In the illustrated example, the positive input combined bias signal 342 is coupled to the gate of the transistor 347 coupling the negative output node 315 to VSS 312 during the sampling phase of the sampling clock signal 318. The negative input combined bias signal 344 is coupled to the gate of the transistor 345 coupling the positive output node 314 to VSS 312 during the sampling phase of the sampling clock signal 318. The sampling clock signal 318 is coupled to the gate of transistor 346, which is in series with transistors 347 and 345 and VSS 312.

FIGS. 3F-3H illustrate example clock generator circuitry for generating the control signals used to control the circuits of FIGS. 3A-3E.

FIG. 3F illustrates an example clock generator circuit to generate the resolver clock signal 301 and the sampling clock signal 318. The generator includes a base clock input 348. In some implementations, such as the example in FIG. 1, the base clock signal 301 may be at ½ the frequency of the data signal bit-rate to be received. In these implementations, there may be two instances of the clock generation circuitry for the system. The base clock signal 348 for the two instances are inverted with respect to each other (i.e., 180° out of phase). The first instance is used for the first branch 105 and the second instance is used for the second branch 120. Accordingly, in the example of FIG. 1, the first and second resolvers 111, 115 of branch 105 are gated by a resolver clock signal 130 and the third and fourth resolvers 112, 113 of branch 120 are gated by an inverse resolver clock signal 131.

The base clock input signal is delayed by a series of inverters 349-352, which operate as delay elements. In the illustrated example, four inverters 349, 350, 351, and 352 are employed. However, in other example, more or fewer elements may be used. The resolver clock signal 301 is obtained as the output of the series of inverters 349-352, and is therefore an offset of the base clock signal 348.

To generate the sampling clock signal, an offset clock signal (R_CLK-O) 356 is obtained from the output of the first inverter 349. This offset clock signal 356 and the resolver clock signal 301 are input into a NOR gate 354 to generate the sampling clock signal 318.

FIG. 3G illustrates an example clock generator circuit to generate the first qualified clock signal 333. In this example, the resolver clock signal 301 and offset clock signal 356 (e.g., the two signals used to generate the sampling clock signal 318) are input into a NOR gate 358. Additionally, the signal on the positive line of the second tap data signal 357 is input into the NOR gate 358. According the first qualified sampling pulse signal 333 comprises the sampling pulse signal 318 AND'ed with the signal on the first line of the second tap of the differential data signal.

FIG. 3H illustrates an example clock generator circuit to generate the second qualified clock signal 334. In this example, the resolver clock signal 301 and the offset clock signal 356 are input into a NOR gate 360. Additionally, the signal on the negative line 361 of the second tap data signal in input into the NOR gate 360. Accordingly, the second qualified clock signal 334 comprises a second qualified sampling pulse signal comprising the sampling pulse signal 318 AND'ed with the signal on the second line of the second tap of the differential data signal.

FIG. 3I illustrates example clock signals generated by the circuitry of FIGS. 3F-3H. As illustrated, the resolver clock signal 301 has a sampling phase 373-375 and a reset phase 371-373. The sampling pulse signal 318 corresponds to the resolver clock signal 301 NOR'ed with the offset resolver clock signal 356, plus a small delay corresponding to the NOR gate used to form the sampling pulse signal 318.

Figure 4:
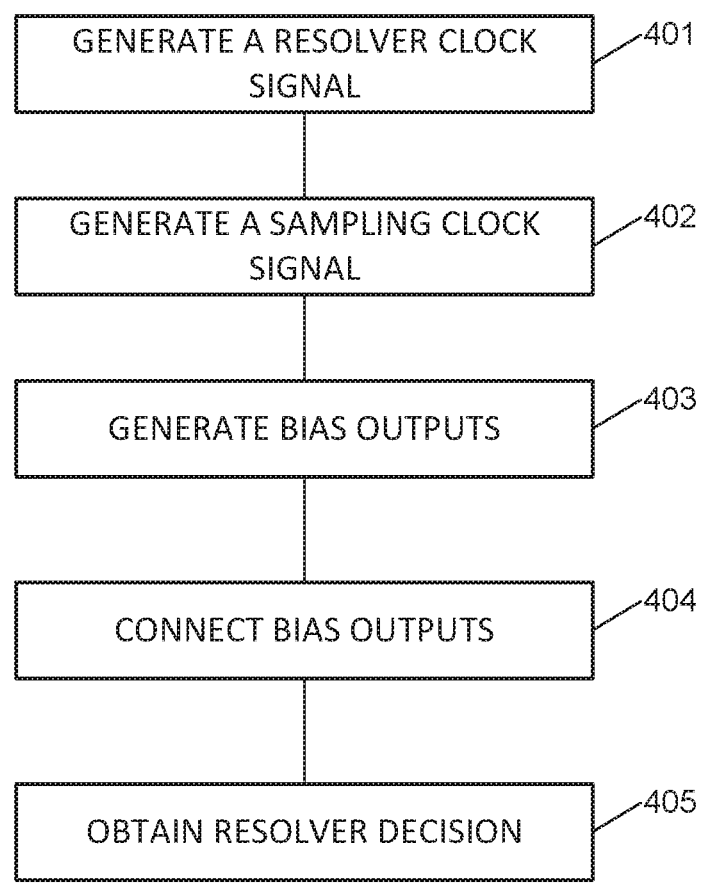
FIG. 4 illustrates an example method of system operation.

FIG. 4 illustrates an example method of system operation. For example, the illustrated method may be performed using the system of FIG. 1, FIGS. 2A-B, or FIGS. 3A-I.

The method includes block 401. Block 401 includes generating a resolver clock signal. The resolver clock signal has a resolver reset phase and a resolver sample phase. For example, the resolver clock signal may be as implemented described with resolver clock signal 212 of FIG. 2B or resolver clock signal 301 of FIGS. 3A-I. For example, block 401 may be using clock generation circuitry, such as the circuitry of FIG. 3F.

The method further includes block 402. Block 402 includes generating a sampling clock signal. The sampling clock signal has a sampling phase, a hold phase and a sampling reset phase. The sampling phase begins during the resolver reset phase, the generation of the reset phase beginning after the beginning of the resolver sample phase. For example, the sampling clock signal may be as described with respect to signal 213 of FIG. 2A-B or signal 318 of FIGS. 3B-I. For example, the generation phase may be as described with respect to the sampling phase of the signal 318 and the generation of the reset phase may be as describe respect to the reset phase of the signal 318.

In some example, block 402 may further comprise generating qualified sampling clock signals. For example, the qualified sampling clock signals may be as described with respect to signals 333 and 334 of FIGS. 3D and 3G-I. For example, block 402 may include generating a first qualified sampling clock signal having a first qualified sampling phase coinciding with the sampling phase of the sampling clock signal and a first qualified sampling hold phase coinciding with the hold phase of the sampling clock signal when a second tap data signal is a first value. Block 402 may further include generating a second qualified sampling clock signal having a second qualified sampling phase coinciding with the sampling phase of the sampling clock signal and a second qualified hold phase coinciding with the hold phase of the sampling clock signal when the second tap data signal is a second value.

The method further includes block 403. Block 403 comprises amplifying a main input data differential output during the sampling phase and holding the amplified output during the hold phase. For example, block 403 may be performed by a circuit such as the circuit for FIG. 3B. In this example, during the sampling and hold phases of the sampling clock signal 318, the transistor 319 is activated and the bias circuit generates the input data differential output.

In further examples, block 403 comprises generating further bias outputs for the DFE. For example, block 403 may include generating a first tap bias signal, a second tap bias signal, and on or more further tap bias signals, such as a combined signal combining the outputs of third through fourteenth tap bias voltage generators. For example, block 403 may be further performed as described with respect to the operation FIGS. 3C-E.

The method further includes block 404. Block 404 comprises connecting the main input data differential to a resolver during the hold phase of the sampling clock signal. For example, block 404 may be performed as described with respect to the circuit of FIG. 3A. During the hold phase, the transistor 311 is active and the transistor 319 is active such that the main input data differential output is connected to the resolver.

In further examples, block 404 comprises connecting further bias signals to the resolver. For example, block 404 may comprise connecting the first tap bias signal to the resolver during the hold phase of the sampling clock signal. Block 404 may further comprise connecting a positive second tap bias voltage to the resolver during the first qualified hold phase and connecting a negative second tap bias voltage to the resolver during the second qualified hold phase. Additionally, block 404 may comprise connecting the combined tab bias signal to the resolver during the hold phase of the sampling clock signal.

The method further includes block 405. Block 405 comprises obtaining a resolver decision during the resolver sample phase. For example, block 405 may be performed as described with respect to the operation of FIG. 3A. During the resolver sample phase, the resolver clock signal 301 is high, allowing current to flow through the circuit, outputting the resolver decision at differential output 302, 320.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

The invention claimed is:

1. A comparator, comprising:
a pulse generator to generate a resolver clock signal having a resolving phase and a resolver reset phase, and a sampling clock signal having a sampling phase occurring during the resolver reset phase, a hold phase occurring during the resolving phase, and a sample reset phase occurring during the resolving phase and the resolver reset phase;
a resolver controlled by the resolver clock signal to output a decision during the resolving phase and to stop output during the resolver reset phase;
a differential amplifier connected to the resolver and controlled by the sampling clock signal to amplify an input differential signal during the sampling phase, hold the amplified sampling clock signal during the hold phase, and be reset during the sample reset phase.

2. The comparator of claim 1, further comprising:
a qualified tap circuit to influence the resolver with a bias voltage during the hold phase, the qualified tap circuit comprising a first qualified differential amplifier controlled by a first qualified clock signal and a second qualified differential amplifier controlled by a second qualified clock signal; wherein
the pulse generator generates a first qualified clock signal pulse coinciding with the sampling phase if a tap data signal corresponding to the qualified tap circuit has a first value, and
the pulse generator generates a second qualified clock signal pulse coinciding the sampling phase of the sampling clock signal if the tap data signal corresponding to the qualified tap circuit has a second value.

3. The comparator of claim 2, wherein the pulse generator comprises:
a first NOR gate to output the first qualified clock signal, the first NOR gate coupled to the resolver clock signal, an offset resolver clock signal, and a first line of the tap data signal; and
a second NOR gate to output the second qualified clock signal, the second NOR gate coupled to the resolver clock signal, the offset resolver clock signal, and a second line of the tap data signal.

4. The comparator of claim 2, wherein the input differential signal is a main input data signal.

5. The comparator of claim 4, further comprising a second differential amplifier coupled to a first input tap to influence the resolver with an offset voltage during the hold phase.

6. The comparator of claim 5, further comprising a third differential amplifier controlled by the sampling clock signal to influence the resolver with a combined bias voltage during the hold phase.

7. The comparator of claim 6, wherein the first differential amplifier, the qualified tap circuit, the second differential amplifier, and the third differential amplifier are coupled to the resolver in parallel.

8. The comparator of claim 1, further comprising:
a second differential amplifier controlled by the sampling clock signal to influence the resolver with a combined bias voltage during the hold phase.

9. The comparator of claim 1, wherein the resolver comprises a cross coupled inverter comprising:
a first transistor gated by the resolver clock signal in parallel with a first inverter transistor coupling a first output node with a first power supply voltage;
a second transistor gated by the resolver clock signal in parallel with a second inverter transistor coupling a second output node with the first power supply voltage; and
a third transistor gated by the resolver clock signal in series with a third inverter transistor coupling the first output node to a second power supply voltage and in series with a fourth inverter transistor coupling the second output node to the second power supply voltage.

10. A comparator, comprising:
a first resolver gated by a resolver clock signal and coupled to an output via a multiplexor, the first resolver coupled to an input data signal via a first input data signal circuit, a signed first tap coefficient bias circuit, a first qualified second tap bias circuit, and a first combined tap coefficient bias circuit; and
a second resolver gated by the resolver clock signal and coupled to the output via the multiplexor, the second resolver coupled to the input data signal via a second input data signal circuit, an opposite signed first tap coefficient bias circuit, a second qualified second tap bias circuit, and a second combined tap coefficient bias circuit; wherein
amplification at each input data signal circuit and each bias circuit occurs during a resolver reset phase of the resolver clock signal and reset of each bias circuit begins during a sampling phase of the resolver clock signal.

11. The comparator of claim 10, wherein:
the first resolver comprises a first cross coupled inverter gated by the resolver clock signal and having a pair of storage nodes coupled in parallel to outputs of the first input data signal circuit, the signed first tap coefficient bias circuit, the first qualified second tap bias circuit, and the first combined tap coefficient bias circuit; and
the second resolver comprises a second cross coupled inverter gated by the resolver clock signal and having a second pair of storage nodes coupled in parallel to outputs of the second input data signal circuit, the opposite signed first tap coefficient bias circuit, the second qualified second tap bias circuit, and the second combined tap coefficient bias circuit.

12. The comparator of claim 11, wherein:
the first input data signal circuit comprises a first differential amplifier gated by a sampling pulse signal;
the signed first tap coefficient bias circuit comprises a second differential amplifier gated by the sampling pulse signal;
the first qualified second tap bias circuit comprises a first pair of differential amplifiers, a first amplifier of the first pair gated by a first qualified sampling pulse signal and the second amplifier of the second pair gated by a second qualified sampling pulse signal, wherein the first qualified sampling pulse signal comprises the sampling pulse signal combined with a signal on a first line of a second tap of the input data signal and the second qualified sampling pulse signal comprises the sampling pulse signal combined with a signal on a second line of the second tap; and the first combined tap coefficient bias circuit comprises a third differential amplifier gated by the sampling pulse signal.

13. The comparator of claim 12, further comprising a pulse generator to generate the resolver clock signal, the sampling pulse signal, the first qualified sampling pulse signal, and the second qualified sampling pulse signal; the pulse generator comprising:

a first buffer coupled to a system clock signal to generate a first offset clock signal; a second buffer to receive the first offset clock signal and generate the resolver clock signal as a second offset clock signal;

first NOR logic to receive the resolver clock signal and the first offset clock signal as inputs and to output the sampling pulse signal;

second NOR logic to receive the resolver clock signal, the first offset clock signal, and the signal on the first line of the second tap and to output the first qualified sampling pulse signal; and third NOR logic to receive the resolver clock signal, the first offset clock signal, and the signal on the second line of the second tap and to output the second qualified sampling pulse signal.

14. The comparator of claim 10, further comprising:

a third resolver gated by an inverse resolver clock signal, and coupled to a second output via a second multiplexor, the third resolver coupled to the input data signal via a third input data signal circuit, a second signed first tap coefficient bias circuit, a third qualified second tap bias circuit, and a third combined tap coefficient bias circuit; and a fourth resolver gated by the inverse resolver clock signal, and coupled to the second output via the second multiplexor, the fourth resolver coupled to the input data signal via a fourth input data signal circuit, a second opposite signed first tap coefficient bias circuit, a fourth qualified second tap bias circuit, and a fourth combined tap coefficient bias circuit; wherein:

amplification at the third and fourth input data circuits, the second signed and opposite signed first tap coefficient bias circuits, the third and fourth qualified second tap bias circuits, and the third and fourth combined tap coefficient bias circuits occurs during a reset phase of the inverse resolver clock signal and reset begins during a sampling phase of the inverse resolver clock signal; and the second output controls the first multiplexor and the first output controls the second multiplexor.

15. The comparator of claim 14, wherein:

the third resolver comprises a first cross coupled inverter gated by the inverse resolver clock signal and having a pair of storage nodes coupled in parallel to outputs of the third input data signal circuit, the second signed first tap coefficient bias circuit, the third qualified second tap bias circuit, and the third combined tap coefficient bias circuit; and the fourth resolver comprises a second cross coupled inverter gated by the resolver clock signal and having a second pair of storage nodes coupled in parallel to outputs of the fourth input data signal circuit, the second opposite signed first tap coefficient bias circuit, the fourth qualified second tap bias circuit, and the fourth combined tap coefficient bias circuit.

16. A method, comprising:

generating a resolver clock signal, the resolver clock signal having a resolver reset phase and a resolving phase;

generating a sampling clock signal, the sampling clock signal having a sampling phase occurring during the resolver reset phase, a hold phase occurring at the beginning of the resolving phase, and a sample reset phase;

amplifying a main input data differential signal during the sampling phase;

connecting the amplified main input data signal to a resolver during the hold phase; and obtaining a resolver decision during the resolver sample phase.

17. The method of claim 16, further comprising:

generating a first qualified sampling clock signal having a first qualified sampling phase coinciding with the sampling phase and a first qualified hold phase coinciding with the hold phase when a second tap data signal has a first value;

generating a second qualified sampling clock signal having a second qualified sampling phase coinciding with the sampling phase and a second qualified hold phase coinciding with the hold phase when the second tap data signal has a second value;

amplifying a signed second tap bias voltage during the first qualified sampling phase and connecting the amplified signed second tap bias voltage to the resolver during the first qualified hold phase; and amplifying an opposite signed second tap bias voltage during the second qualified sampling phase and connecting the amplified opposite signed second tap bias voltage to the resolver during the second qualified hold phase.

18. The method of claim 17, further comprising connecting a first tap bias signal to the resolver during the hold phase.

19. The method of claim 18, further comprising connecting a combined tab bias signal to the resolver during the hold phase.

* * * * *